United States Patent
Chalamalasetti et al.

(10) Patent No.: US 11,853,846 B2
(45) Date of Patent: Dec. 26, 2023

(54) ACCELERATION OF MODEL/WEIGHT PROGRAMMING IN MEMRISTOR CROSSBAR ARRAYS

(71) Applicant: HEWLETT PACKARD ENTERPRISE DEVELOPMENT LP, Houston, TX (US)

(72) Inventors: Sai Rahul Chalamalasetti, Milpitas, CA (US); Paolo Faraboschi, Milpitas, CA (US); Martin Foltin, Fort Collins, CO (US); Catherine Graves, Milpitas, CA (US); Dejan S. Milojicic, Milpitas, CA (US); John Paul Strachan, Milpitas, CA (US); Sergey Serebryakov, Milpitas, CA (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 756 days.

(21) Appl. No.: 17/044,633

(22) PCT Filed: Apr. 30, 2018

(86) PCT No.: PCT/US2018/030219
§ 371 (c)(1),
(2) Date: Oct. 1, 2020

(87) PCT Pub. No.: WO2019/212488
PCT Pub. Date: Nov. 7, 2019

(65) Prior Publication Data
US 2021/0201136 A1    Jul. 1, 2021

(51) Int. Cl.
*G11C 11/00*    (2006.01)
*G06N 3/08*    (2023.01)
*G11C 13/00*    (2006.01)

(52) U.S. Cl.
CPC .......... *G06N 3/08* (2013.01); *G11C 13/0069* (2013.01); *G11C 2213/77* (2013.01)

(58) Field of Classification Search
CPC ............ G11C 13/0069; G11C 13/0004; G11C 13/0007; G11C 2213/79; G11C 2213/72
(Continued)

(56) References Cited

U.S. PATENT DOCUMENTS 7,902,867 B2    3/2011    Mouttet
8,040,743 B2    10/2011    Huang et al.
(Continued)

FOREIGN PATENT DOCUMENTS

EP    1132924    9/2001
EP    1132924 A2    9/2001
(Continued)

OTHER PUBLICATIONS

Ankit et al., "PUMA: A Programmable Ultra-efficient Memristor-based Accelerator", ASPLOS '19, Jan. 30, 2019, 17 pages.
(Continued)

*Primary Examiner* — Son T Dinh
(74) *Attorney, Agent, or Firm* — Hewlett Packard Enterprise Patent Department

(57) ABSTRACT

A crossbar array includes a number of memory elements. An analog-to-digital converter (ADC) is electronically coupled to the vector output register. A digital-to-analog converter (DAC) is electronically coupled to the vector input register. A processor is electronically coupled to the ADC and to the DAC. The processor may be configured to determine whether division of input vector data by output vector data from the crossbar array is within a threshold value, and if not within the threshold value, determine changed data values as
(Continued)

between the output vector data and the input vector data, and write the changed data values to the memory elements of the crossbar array.

20 Claims, 5 Drawing Sheets

(58) Field of Classification Search
USPC .......................................... 365/148, 189.07
See application file for complete search history.

(56) References Cited

U.S. PATENT DOCUMENTS

| | | | |
|---|---|---|---|
| 9,588,908 B2 | 3/2017 | Cambou | |
| 2013/0028004 A1 | 1/2013 | Snider | |
| 2013/0054886 A1 | 2/2013 | Eshraghian et al. | |
| 2016/0364643 A1* | 12/2016 | Cruz-Albrecht | G06N 3/049 |
| 2017/0178725 A1 | 6/2017 | Yang et al. | |
| 2018/0069536 A1 | 3/2018 | Roy et al. | |

FOREIGN PATENT DOCUMENTS

| | | |
|---|---|---|
| WO | 2017/105517 A1 | 6/2017 |
| WO | WO-2017105517 | 6/2017 |

OTHER PUBLICATIONS

Chi, et al., "PRIME: a novel processing-in-memory architecture for neural network computation in ReRAM-based main memory", ISCA 2016, Jun. 18-22, 2016, 13 pages.

Haron et al., "Parallel Matrix Multiplication on Memristor-based Computation-in-memory Architecture", Jul. 18-22, 2016, 8 pages.

Hu et al., "Dot-product engine for neuromorphic computing: Programming 1T1M crossbar to accelerate matrix-vector multiplication", 53nd ACM/EDAC/IEEE Design Automation Conference (DAC), Jun. 5-9, 2016, 6 pages.

International Search Report and Written Opinion received for PCT Application No. PCT/US2018/030219, dated Feb. 22, 2019, 13 pages.

Shafiee et al., "ISAAC: A Convolutional Neural Network Accelerator with In-Situ Analog Arithmetic in Crossbars", International Symposium on Computer Architecture (ISCA) 2016, Oct. 5, 2016, 13 pages.

Haron, A. et al., "Parallel Matrix Multiplication on Memristor-Based Computation-in-Memory Architecture," 2016, 9 pages.

Hu, M. et al., "Dot-Product Engine for Neuromorphic Computing: Programming 1T1M Crossbar to Accelerate Matrix-Vector Multiplication," Jun. 2016, 6 pages.

* cited by examiner

ACCELERATION OF MODEL/WEIGHT PROGRAMMING IN MEMRISTOR CROSSBAR ARRAYS

STATEMENT OF GOVERNMENT SUPPORT

This invention was made with government support under Contract No. 2017-17013000002 awarded by IARPA. The Government has certain rights in this invention.

BACKGROUND

Memristor crossbar arrays may be used to accelerate computations in the generation of deep neural networks. Computational workloads associated with deep neural networks generally include a training phase and classification phase. The training phase builds a model as a result of the computation of large training datasets. The classification phase accepts the model generated by the training phase to determine a solution based on an evaluation of new data as applied to the model.

The training phase is computationally and data intensive. A memristor crossbar array may be used for matrix dot product calculations during the training phase. During a backward pass of the training phase, changes in model/weights are made from a last layer of a model to a first layer of a model. The memristor crossbar array may be iteratively updated, and matrix dot product calculations performed to determine an optimum model.

Using the matrix dot product computation structure of the memristor crossbar array, provides lower external memory bandwidth requirements as compared to traditional integrated circuits, such as complementary metal-oxide-semiconductor (CMOS) circuits. However, in certain instances updating model/weight data otherwise already contained in a memristor crossbar array during the training phase may lead to processing inefficiency.

BRIEF DESCRIPTION OF THE DRAWINGS

The present disclosure is best understood from the following detailed description when read with the accompanying Figures. It is emphasized that, in accordance with the standard practice in the industry, various features are not drawn to scale. In fact, the dimensions of the various features may be arbitrarily increased or reduced for clarity of discussion.

SUMMARY

Figure 1:
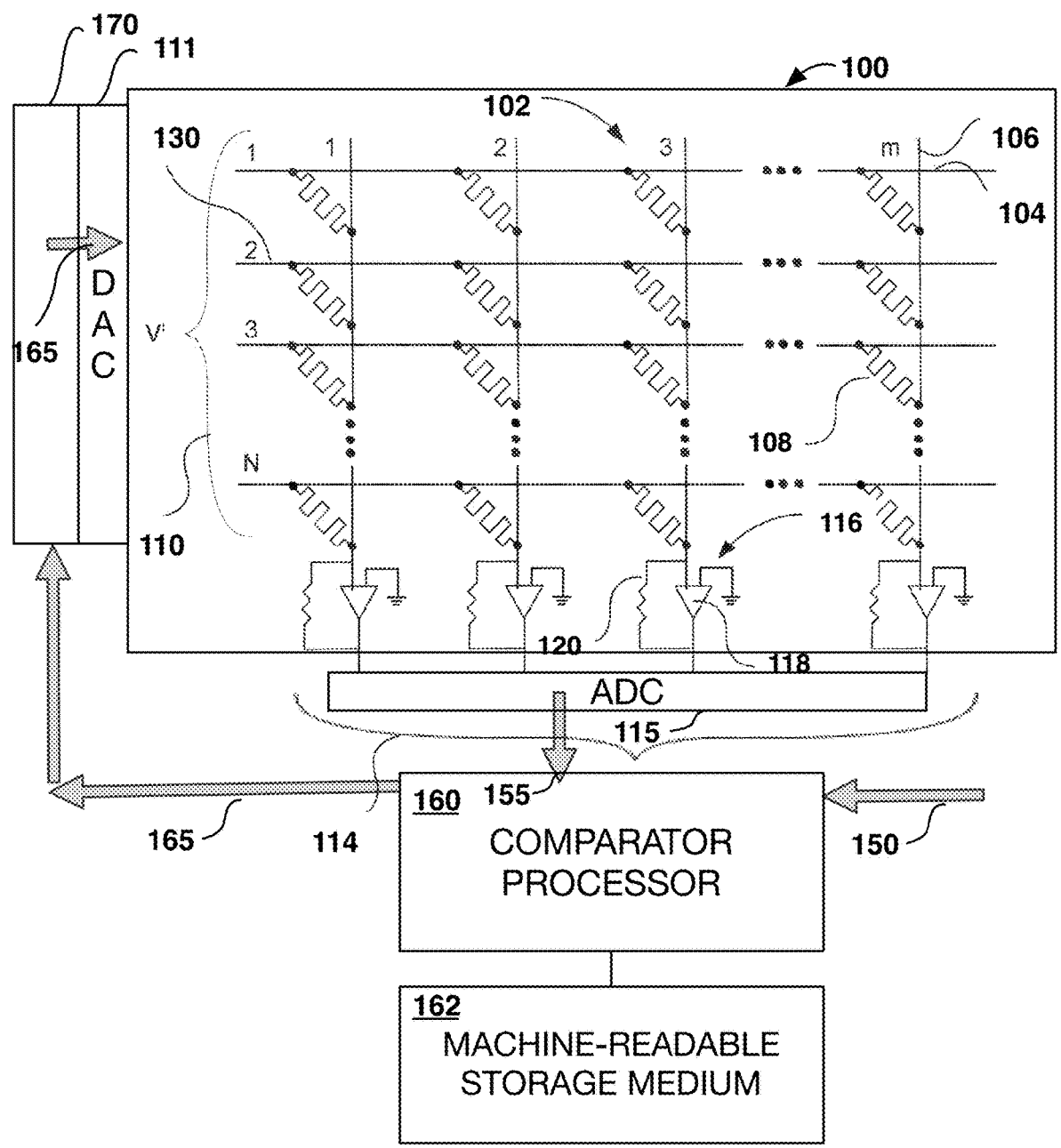
FIG. 1 is a diagram of an example memristive dot-product engine with a comparator processor.

Embodiments of the present disclosure are directed to a memristive dot product system for vector processing, and related method and non-transitory computer storage device storing instructions operable to cause one or more computer processors to perform the method.

In one embodiment, a crossbar array includes a number of memory elements. Each memory element may include a memristor and a transistor in series with one another. The crossbar array has N rows, M columns and N×M memory elements. A vector input register has N voltage inputs to the crossbar array. A vector output register has M voltage outputs from the crossbar array. An analog-to-digital converter (ADC) is electronically coupled to the vector output register. A digital-to-analog converter (DAC) is electronically coupled to the vector input register. A comparator processor is electronically coupled to the ADC and to the DAC. The comparator processor is configured to compare output vector data from the vector output register to input vector data from a memory register, determine changed data values as between the output vector data and the input vector data, and write the changed data values to the memory elements of the crossbar array.

The comparator processor may include a circuit to retrieve output vector data via the ADC for a row of the crossbar array. The comparator processor may include an EXOR circuit that calculates an exclusive OR between the input vector data and the output vector data to determine the changed data values. The comparator processor may include a circuit to write the changed data values via the DAC to a memory element of the crossbar array. The memory register for the input vector data may be a memory location distinct from the memory elements of the crossbar array. The input vector data may be data that represents an n-dimensional vector of numerical values, for example, data describing a plurality of model weights for training a neural network.

In another embodiment, a crossbar array includes a number of memory elements. Each memory element may include a memristor and a transistor in series with one another. The crossbar array has N rows, M columns and N×M memory elements. A vector input register has N voltage inputs to the crossbar array. A vector output register has M voltage outputs from the crossbar array. An analog-to-digital converter (ADC) is electronically coupled to the vector output register. A digital-to-analog converter (DAC) is electronically coupled to the vector input register. A processor is electronically coupled to the ADC and to the DAC. The processor is configured to determine whether the absolute value of the division of new delta of weights by old weights is less than a threshold value. For the weights changes that are greater than the threshold value, the processor determines changed data values, and writes the changed data values to the memory elements of the crossbar array.

DETAILED DESCRIPTION

Examples of the subject matter claimed below will now be disclosed. In the interest of clarity, not all features of an actual implementation are described in this specification. It will be appreciated that in the development of any such actual example, numerous implementation-specific decisions may be made to achieve the developer's specific goals, such as compliance with system-related and business-related constraints, which will vary from one implementation to another. Moreover, it will be appreciated that such a development effort, even if complex and time-consuming, would be a routine undertaking for those of ordinary skill in the art having the benefit of this disclosure.

Computational workloads associated with creating deep neural networks generally include a training phase and classification phase. During the training, the neural network tries to learn from a set of input training data. Each layer of an untrained model is assigned some random weights and a classifier runs a forward pass through the input training data. This forward pass predicts class labels and determines scores using the weights. The class scores are compared against actual labels, and an error is computed with a loss function. Then in a backward pass the error is back propagated through the neural network and weights are updated. For example, the weights may be updated via an algorithm such as gradient descent. The gradient descent algorithm is an optimization algorithm used to find values of parameters (i.e., coefficients) of a function that minimizes a cost function.

An epoch refers to a complete forward pass and backward pass through all of the samples of the input training data. Typically, using traditional CMOS-based CPUs these computations are very expensive, and are performed using a single weight update after processing for every sample. In this case, training data is separated into batches, and weights are updated after each batch.

The common computation structure (matrix dot product) used in the deep learning workloads has led to application of GPUs for providing performance speed up over the traditional CPU. A GPU is more capable of handling vector and matrix calculations than a CPU. A single or parallel graphical processing units (GPUs) may be used to speed up the processing. However, GPUs which have been built for graphics applications are not fully optimized for the deep learning workloads requirements and suffer from performance and energy inefficiency.

Using a memristor crossbar array further decreases processing times over GPUs, and the memristor crossbar array provides for high computation performance with lower energy requirements. A memristor crossbar array may be used for matrix dot product calculations during the training phase. During a backward pass of the training phase, changes in model/weights may be made from a last layer of a model to a first layer of a model. The memory memristor crossbar array may be iteratively updated with the model/weights, and matrix dot product calculations performed to determine an optimum model.

Comparator circuitry electronically coupled to a vector output register of a memristor crossbar array may compare already available data in the memristor crossbar array with the new model/weights data being written to the crossbar array. In one example, only unmatched values in the memristor crossbar array are updated leaving matched values intact. In another example, absolute delta weight values of new model weights are evaluated against a threshold to determine whether to update the crossbar array.

In deep learning processing, the comparator circuitry reduces the number of write operations to the crossbar array, thereby accelerating overall computational processing efficiency, and reducing overall processing times for the training phase of the neural network.

An example memristive crossbar array is now described for use in neural network deep learning applications. While a particular example of a memristive crossbar array is described, other configurations of memristive crossbar arrays may be used. FIG. 1 illustrates a memristive dot-product engine 100 having a single vector of voltage. The dot-product engine 100 includes a crossbar array 102 including N row electrodes 104 and M column electrodes 106. Each crossbar junctions throughout the crossbar array 102 include a memristive element 108, thereby forming a memory element of the dot-product engine. Each memory element may include a memristor and a transistor in series with one another. The dot-product engine 100 includes a vector input register or vector input 110 for applying voltages to the row electrodes 104 and a vector output register or vector output 114 for receiving output voltages resulting from current flows in the column electrodes 106. The vector input may be coupled to digital to analog convertor 111 to convert digital values to analog values for writing to the crossbar array 102. The vector output 114 may include an analog to digital convertor 115 to convert analog values to digital values. The dot-product engine 100 also includes sense circuitry 116 for converting an electrical current in a column electrode 106 to a voltage. In an example, the sense circuitry 116 includes an operational amplifier 118 and a resistor 120, which can be arranged to represent a virtual ground for read operations.

The dot-product engine 100 may also include other peripheral circuitry associated with crossbar arrays 102 used as storage devices. For example, the vector input 110 may include drivers connected to the row electrodes 104. An address decoder can be used to select a row electrode 104 and activate a driver corresponding to the selected row electrode 104. The driver for a selected row electrode 104 can drive a corresponding row electrode 104 with different voltages corresponding to a vector-matrix multiplication or the process of setting resistance values within the memristive elements 108 of the crossbar array 102. Similar driver and decoder circuitry may be included for the column electrodes 106. Control circuitry may also be used to control application of voltages at the inputs and reading of voltages at the outputs of the dot-product engine 100. Digital to analog circuitry and analog to digital circuitry may be used at the vector inputs 110 and at the vector output 114. Input signals to the row electrodes 104 and column electrodes 106 can be either analog or digital. The peripheral circuitry above described can be fabricated using semiconductor processing techniques in the same integrated structure or semiconductor die as the crossbar array 102 in the above example. As described in further detail below, there are two main operations that occur during operation of the dot-product engine. The first operation is to program the memristors in the crossbar array so as to map the mathematic values in an N×M matrix to the array. In one example, only one memristor is programmed at a time during the programming operation. The second operation is the dot-product or matrix multiplication operation. In this operation, input voltages are applied and output voltages obtained, corresponding to the result of multiplying an N×M matrix by an N×1 vector. The input voltages are below the threshold of the programming voltages so the resistance values of the memristors in the array 102 are not changed during the matrix multiplication operation.

The dot product engine 100 may include an analog-to-digital converter 115 to convert analog signals of the vector output register 114 to digital values. The dot product engine 100 may include a digital-to-analog converter 111 to convert digital values to analog values to the vector input register 110.

The dot product engine 100 may be electronically coupled to comparator processor 160. The comparator processor 160 may be integrally coupled to the dot product engine 100 and formed as a part thereof. The comparator processor 160 may be a separate component, such as an integrated circuit, or separate processor. The comparator processor 160 may be one or more central processing units (CPUs), semiconductor-based microprocessors, and/or other hardware devices suitable for retrieval and execution of instructions stored in machine-readable storage medium. The comparator processor may fetch, decode, and execute instructions, to control processes for comparing and/or evaluating data received, as shown by arrow 115, from the dot product engine 115 to an input data source, as shown by arrow 150 to the comparator processor. As an alternative or in addition to retrieving, and executing instructions, the comparator processor 160 may include one or more electronic circuits that include electronic components for performing the functionality of one or more instructions, e.g., a Field Programmable Gate Array (FPGA) or Application Specific Integrated Circuit (ASIC). The comparator processor may include memory for storing executable instructions, and/or be couple to a separate storage medium 162.

A machine-readable storage medium, such as 162, may include both volatile and nonvolatile, removable and non-removable media, and may be any electronic, magnetic, optical, or other physical storage device that contains or stores executable instructions, data structures, program module, or other data accessible to comparator processor 160, for example firmware, erasable programmable read-only memory (EPROM), random access memory (RAM), non-volatile random access memory (NVRAM), optical disk, solid state drive (SSD), flash memory chips, and the like. The machine-readable storage medium may be a non-transitory storage medium, where the term "non-transitory" does not encompass transitory propagating signals.

The comparator processor 160 may perform a method for comparing and/or evaluating input vector data (as represented by arrow 150) to output vector data (as represented by arrow 155) already loaded into the memristor memory of the dot product engine 100. The comparator processor 160 may provide changed data values (as represented by arrow 165) to another circuit or processor 170 to write the changed data values back to the memristor memory of the dot product engine 100.

The input vector data may be received by the comparator processor 160 from another processor or program. Additionally, the comparator processor 160 may retrieve the input vector data from a memory register (not shown) that is distinct from the memory elements of the memristor crossbar array. The input vector data may be data in the form of an n-dimensional vector of numerical values.

Now further aspects of a neural network will be described. A neural network is a composite differentiable function that represents a data flow from its inputs to its outputs in the form of a directed acyclic graph (or compute graph). Each node in such a graph is a simple function realizing a specific data transformation. In the interest of clarity, a neural network compute graph is represented in this specification as a linear graph and nodes in such a graph are called layers (a linear graph is a graph with exactly one path from its inputs to its outputs; if a compute graph is not linear, it can be linearized by joining neighboring nodes). An input layer of the neural network directly operates with received input data, and an output layer provides neural network decisions based on the layers in between the input layer and the output layer (also known as hidden layers). The hidden layers transform input data to the output layer. The output layer then may be used for subsequent processing and/or decision making. The flow of processing may be illustrated as inputs→Layer$_1$→Layer$_2$→Layer$_3$→ . . . →Layer$_{N-1}$→OutputLayer→decisions.

A neural network may be represented generally by two types of objects. The first type of object defines a computation structure (for example, a compute graph) which connects inputs via a series of operators (for example, transformations or functions) to outputs. The second type of object are weights that are referenced by operators in the compute graph either by name or index. During training of a neural network, the weights of the neural network may be updated. One method of updating weights is through a technique referred to as backward propagation of errors, as an error is calculated at the output layer and then distributed back through the hidden layers.

Weights of a neural network may be represented as a collection of indexed or collection of named tensors of numerical values. If weights are represented as a collection of named tensors, a neural network' operators may reference data by a name. If weights are represented as a list of tensors where each tensor has an associated index in the list, neural network' operators may reference data by index. There are no restrictions on how tensors' numerical values are stored (for example, a regular single precision format (float32), half precision format (float16), integer format (int8) or any other format suitable for a particular compute device). Each tensor is a collection of one or more matrices. For instance, a scalar number (tensor of rank 0) is a one matrix of dimensions 1×1. A vector (tensor of rank 1) is a one matrix of dimensions N×1. A matrix (tensor of rank 2) is a one matrix of dimensions N×M. A cube of numbers (tensor of rank 3) is a collection of k matrices of dimensions N×M etc. A compiler takes neural network's compute graph and maps the operators to available crossbar arrays. Once this mapping is done, then data tensors associated with the operators may be written to memory cells of the associated crossbar arrays.

A typical i-th weight update may be represented by the formula: $w_i = w_i - \alpha * dw_i$, where $w_i$ is an i-th weight of a neural network, $\alpha$ is a learning rate and $dw_i$ is the i-th weight gradient. This formula may be rewritten as: $w_i = w_i + \nabla w_i$ where $\nabla w_i = -\alpha * dw_i$ is a weight update (delta) that may be written into memristor memory. Deltas for weights in a particular layer may be computed based on deltas from an upstream layer i.e. this is a recurrent dependency. For example, ∇output_layer=error_function(decisions,correct_decisions)

∇Layer$_{N-1}$=some_function(∇output_layer)

∇Layer$_{N-2}$=some_function(∇Layer$_{N-1}$)

The some_function depends on the particular type of a layer and may differ from layer to layer. The error_function provides a starting point, and the error_function provides errors (which is the same as deltas) for the output layer.

For example, assume solving for a classification problem, the decisions is a vector of length K containing conditional probabilities for input data to belong to a particular class. For instance, if a neural network has 4 classes—dog, cat, car and tree, and one wants to identify what the main object is in an input image, the decisions vector may look like: [0.1, 0.1, 0.8, 0.0]. These values represent that the determination by the neural network that the input image is a dog with a probability of 10%, a cat with a probability of 10%, a car with a probability 80%, and a tree with a probability 0%. If the input image is indeed a car, the correct_decisions vector will look like this: [0.0, 0.0, 1.0, 0.0]. To compute the array with deltas in this example, the following formula may be used:

∇$_i$=−correct_decisions$_i$ log(decisions$_i$) for all $i=1 \ldots 4$

This computation determines a cross entropy loss (error, delta). In this particular example, there are four deltas (for all outputs), and basically would not be zero for "true" output that corresponds to "car" (for others classes, correct_decisions contains zeros).

The deltas for a layer L determine the error of this layer L. The layer L could be an output layer, or a hidden layer. To correct the error in the neural network, the deltas are back propagated to a previous layer L−1 according to some function, and parameters of layer L given these deltas are updated. If there are no parameters, the weight update is skipped and only the deltas are back propagated through that layer.

The methods now described below are particularly suited for updating a memristor crossbar arrays during a back propagation (i.e., backward) phase for neural network layers that have weights. The described methods limit the updating of weights previously stored in a crossbar array. The methods determine whether an output of vector data stored in a crossbar array differs from input vector data being written to the crossbar array. In one example as described in FIG. 2, a method compares particular values between the input vector data to output vector from a memristor (bock 230), and updates only the changes in values. In another example as described in FIG. 5, a method compares the delta of input vector data divided by the output vector data stored in the memristor array as to a threshold value (block 530). The particular processing of the methods are now described below.

The following pseudo code illustrates an example comparison of input vector data to data already loaded into the memristor memory. The vector input data is received from an upstream layer of a neural network. The brackets { } indicate grouping of logical units of code within the brackets. The forward slashes // indicate comments for text after the brackets.

Line 001: Comparison_Junction ( )
Line 002: {for i=0;i<number_of_rows; i++ //
Line 003: {data_to_comp=memristor[i]; // reading first row
Line 004: If data_to_comp==new_data_to_write //no need to write new data
Line 005: {//do nothing, but row index increments in the XBAR}
Line 006: Else //write new data in to specific cells
Line 007: {changed_columns_bits=data_to_comp_^new_data_to_write; // perform ex-or operation detect differences of input data versus read data from memristor
Line 008: for j=0; j<number_of_columniDits; j++
Line 009: {If changed_columns_bits[j]==1 //a column bit, is changes with respect to the input data
Line 010: write_to_memristor[i][j]<=new_data_to_write[j]; //writing specific changed bit to the cell in the row
}}}}

The comparison_function at Line 001 is called or performed by the comparator processor 160, via control circuitry, or execution of a program, application, daemon or service. At Line 002, the method iterates through a predetermined number of rows of the memristor array. The method uses a for loop logic construct, for i=0; i<number_of_rows; i++, to evaluate each row, and increment to the row number value for each successive iteration. The value i is an index value used to reference a particular row number.

At Line 003, the method sets a variable data_to_comp to the data value of memristor row[index i]. For example if index i is set to 0, then the data_to_comp variable is set to the value of memristor row [0]. If index i is set to 1, then the data_to_comp variable is set to the value of memristor row [1].

At Line 004, the method compares a variable new_data_to_write to the data_to_comp variable to determine if the values are equal. The new_data_to_write is a sub-vector of the input vector data corresponding to current index i. If the data_to_comp value equals the new_data_to_write value, then the memristor row [index i] is already is set to the new_data_to_write value. In this instance, the method does not need to update the memristor. In other words, the memristor would not be updated with new weight values.

The method then increments the index value 1 in of the for loop logic in Line 002.

At Line 006, if the data_to_comp values are not equal, the method otherwise performs the following steps. At Line 007, the variable changed_columns_bits is set to value of an XOR operation for the data_to_comp value, and the new_data_to_write value. The method performs an XOR operation to detect differences of the input vector data as compared to the data from the memristor.

At Line 002, the method iterates through a predetermined number of column bits of the memristor array. The method uses a for loop logic construct, for j=0;j<number_of_column bits; j++, to evaluate each row, and increment to the row number value for each successive iteration. The value j is an index value used to reference a particular changed column bit.

At Line 009, the method determines if a particular changed_column_bits indexed by the value j is equal to the value 1. Here the method determines if a column bit has been changed. At Line 010, if the particular column bit has changed where the expression changed_columns_bits[j]==1 is true then the method performs a write to the memristor.

The for loop logic construct loops through and increments the value of j. The write_to_memristor[i][j] updates the memristor with the value of the particular updated column bit. The method writes the specific changed bit to a cell in the memristor row.

Figure 2:
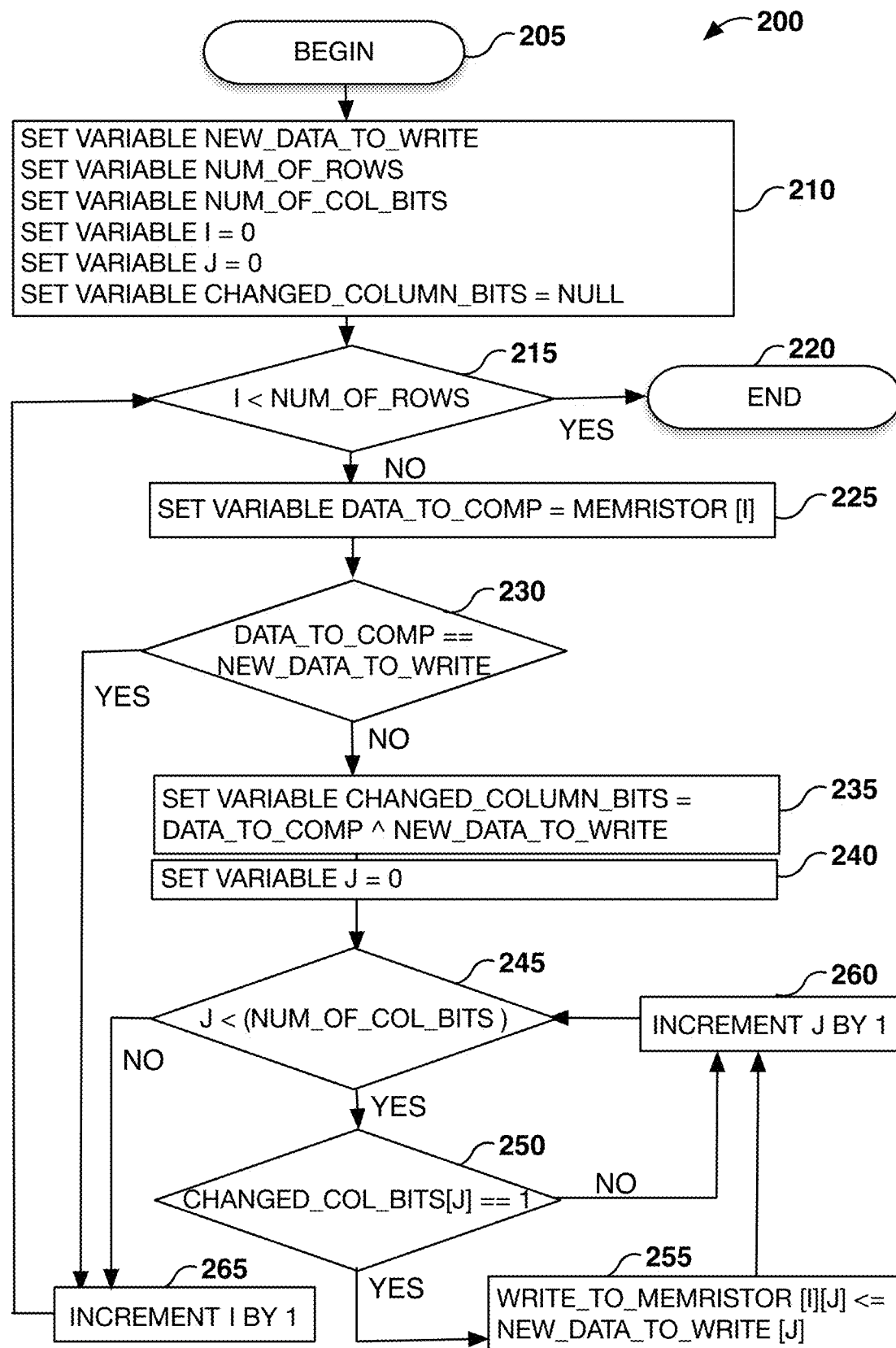
FIG. 2 is a flowchart of an example method for comparing input vector data as to vector data previously loaded into a memristor memory.

FIG. 2 is a flowchart of an example method 200 for comparing input vector data to vector data previously loaded into a memristor memory. The method 200 begins (block 205) and initializes a set of variables (block 210). The variable NEW_DATA_TO_WRITE is the received data input. The variable NUM_OF_ROWS are the number of memristor rows as determined by number_of_rows of memristor array (N) shown in the FIG. 1. The variable NUM_OF_COL_BITS are the number of column bits (M) of the memristor as determined by by number of columns of memristor array shown in the FIG. 1. Column bits of the memristor are the data read from M column elements of the memristor array. Variables I and J are used for used for for-next loop counters as index values. The variable CHANGED_COLUMN_BITS is initialized to NULL, or can be initialized to FALSE.

The method determines if the NUM_OF_ROWS value is greater than the value of variable I (block 215). The first instance of this evaluation I will be set to zero. If the NUM_OF_ROWS value is greater then I, then the method will end (block 220). If the NUM_OF_ROWS value is less than or equal to I, then the method will continue. The method will then set the variable DATA_TO_COMP to the MEMRISTOR[index I] (block 225). In this first instance, the variable DATA_TO_COMP is set to the value of MEMRISTOR[index 0]. In this step, the first row of the memristor is read, and the value stored in variable DATA_TO_COMP.

The data type of the variable MEMRISTOR[ ] can support adjustable bits per cell, so any commonly use computer programming datatypes such as integer or floating point can easily be stored in the memristor cell.

The method then compares whether the value for the row of vector data stored in the variable DATA_TO_COMP is equal to the new input vector data as stored in the variable NEW_DATA_TO_WRITE (block 230).

If the value of the variable DATA_TO_COMP is equal to the value of the variable NEW_DATA_TO_WRITE, then the method continues to block 265. If these two values are equal, this means that there is no need to update the memristor row with the input data. At block 265, the value of variable I is incremented by 1. The method then continues to block 215 as described above.

If the value of the variable DATA_TO_COMP is not equal to the value of the variable NEW_DATA_TO_WRITE, then the method continues to block 235. The variable CHANGED_COLUMN_BITS is set to the output value of an EXOR operation for the variable DATA_TO_COMP and the variable NEW_DATA_TO_WRITE (block 225). Here the method is determining the changes of the new input data to the data in a particular row of the memristor. In the next step (block 240), variable J is initialized to the value zero.

The method then continues and updates particular changed column bits of the memristor row. In block 245, the method determined if the value of (NUM_OF_COL_BITS-1) is greater than the value of the variable J. If not, then the method proceeds to block 265, and increments the variable I by the value of 1. If the value of (NUM_OF_COL_BITS-1) is less than or equal to the value of the variable J, then method determines if CHANGED_COL_BITS[index J] is equal to 1. If CHANGED_COL_BITS[index J] is equal to zero, then this means that the data value for the column bit has not changed. The method then continues to block 260 and increments the variable J by a value of 1. If the CHANGED_COL_BITS[index J] is equal to 1, then this means that the data value for the column bit has changed. In this case the method proceeds to block 255. In block 255, the memristor memory location is written to. A write function is called or performed to WRITE_TO_MEMRISTOR[index I][index J] with the value from variable NEW_DATA_TO_W-RITE[index J]. Next the method continues to block 260 and increments the variable J by a value of 1.

Figure 3:
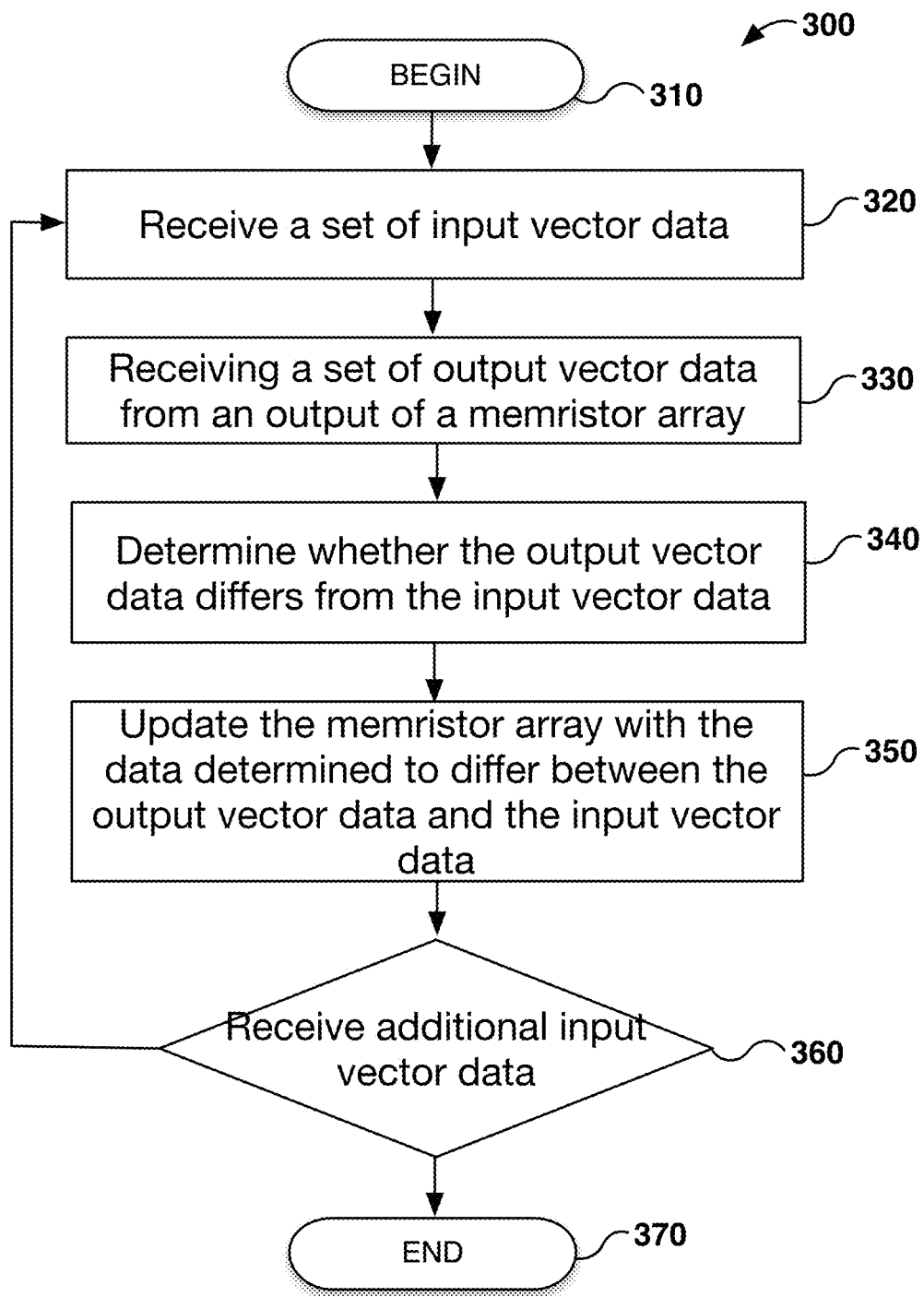
FIG. 3 is a flowchart of an example method for comparing and/or evaluating input vector data to vector data previously loaded into a memristor memory.

FIG. 3 is a flowchart of an example method 300 for comparing and/or evaluating input vector data to vector data previously loaded into a memristor memory. The method begins at block 310. A first set of input vector data is received into a memory register, or some other storage location (block 320). The memory register is a separate memory which is distinct from the memristor memory elements. A set of output vector data is received from an output of a row of the memristor (block 330). The method determines whether the output vector data differs from the input vector data. The method then updates the memristor array with the data determined to be different between the output vector data, and the input vector data. The method then receives addition input vector data and begins again (block 320).

Figure 4:
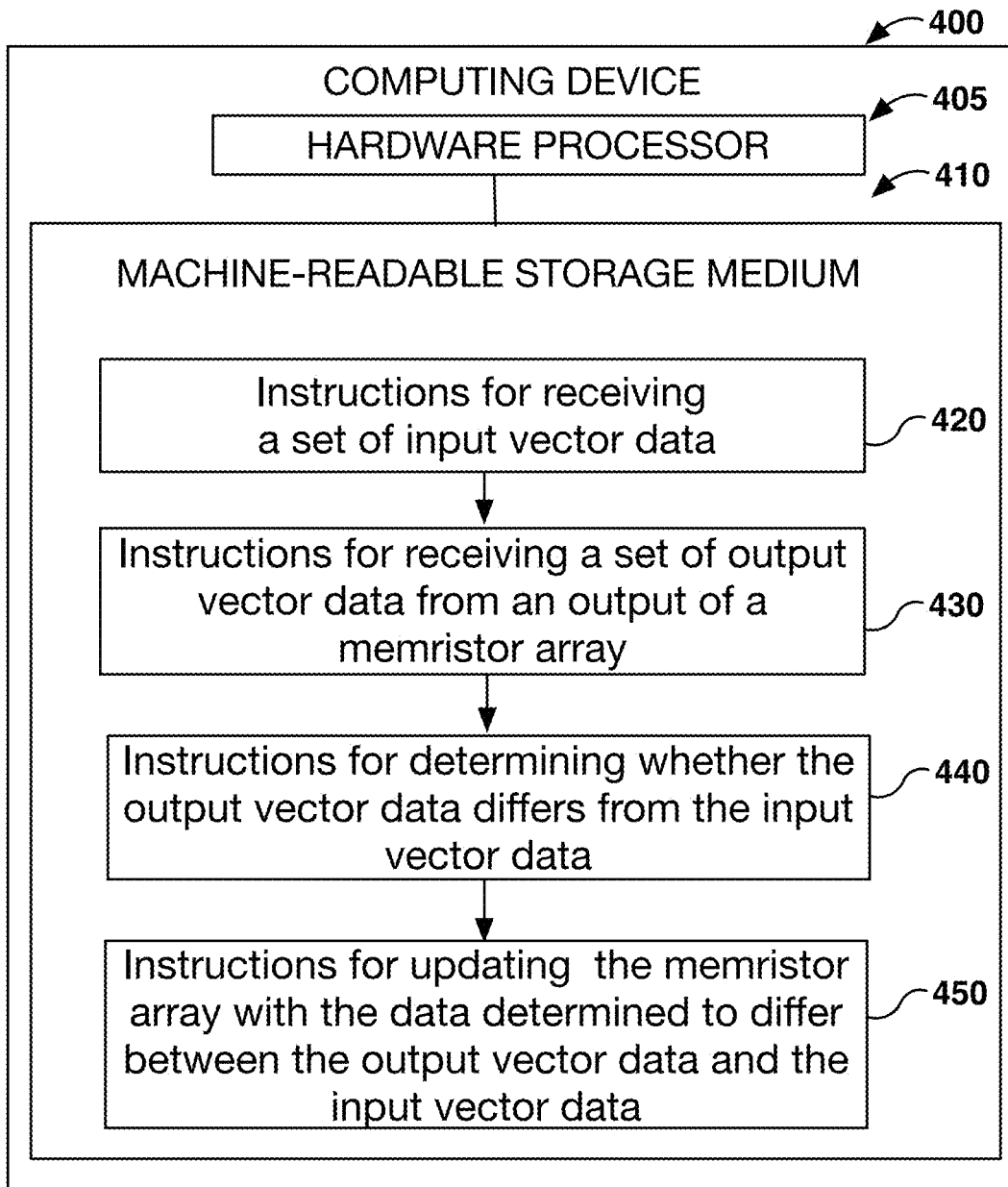
FIG. 4 is an example computing device with a hardware processing, with machine readable instructions for comparing and/or evaluating input vector data as to vector data previously loaded into memristor memory.

FIG. 4 is an example computing device 440 with a hardware processor 405, with machine readable instructions 410 for comparing and/or evaluating input vector data to vector data previously loaded into memristor memory. As described in detail below, the machine-readable storage medium may be encoded with executable instructions 420-450, for performing a comparison of received vector data, and comparing to a vector data resident in a memristor memory.

The executable instructions include instructions for receiving a set of input vector data (block 420). Instructions for receiving a set of output vector data from an out of a memistor array (block 430). Instructions for determining whether the output vector data differs from the input vector data (block 440). Instructions for updating the memristor array with the data determined to differ between the output vector data and the input vector data.

The following pseudo code illustrates an example evaluation of input vector data to vector data already loaded into the memristor memory. The brackets { } indicate grouping of logical units of code within the brackets. The forward slashes // indicate comments for text after the brackets.

Line 101: Comparison_function ( )
Line 102: {for i=0;i<number_of_rows; i++ //
Line 103: {data_to_comp=memristor[i]; // reading first row
Line 104: if(|(Δ new_data_to_write)/data_from_memristor|<threshold) //no need to write new data (may be programmable); this operation may be performed parallel on all the bits
Line 105: {//do nothing, but row index increments in the XBAR}
Line 106: Else //write new data in to specific cells
Line 107: {changed_columns_bits=column_values_that_doesn't_meet_above_threshold_comparision;
Line 108: for j=0; j<number_of_column_bits; j++
Line 109:{If changed_columns_bits[j]==1 //a column bit is changes with respect to the input data
Line 110: write_to_memristor[i][j] new_data_to_write[j]; //writing specific changed bit to the cell in the row }}}}

The comparison_function at Line 101 is called or performed by the comparator processor 160, via control circuitry, or execution of a program, application, daemon or service. At Line 102, the method iterates through a predetermined number of rows of the memristor array. The method uses a for loop logic construct, for i=0; i<number_of_rows; i++, to evaluate each row, and increment to the row number value for each successive iteration. The value i is an index value used to reference a particular row number.

At Line 103, the method sets a variable data_to_comp to the data value of memristor row[index i]. For example if index i is set to 0, then the data_to_comp variable is set to the value of memristor row [0]. If index i is set to 1, then the data_to_comp variable is set to the value of memristor row [1].

At Line 104, the method determines an absolute value of the calculation for the delta of new_data_to_write divided by data_to_comp from the memristor. The new_data_to_write is a sub-vector of the input vector data corresponding to current index i. The input vector data may be vector data from an upstream layer of a neural network. If the |(Δ new_data_to_write)/data_to_comp|<threshold value, then the memristor row [index i] is already set to the new_data_to_write value. In this instance, the method does not need to update the memristor. In other words, the memristor would not be updated with new weight values.

The method then increments the index value i in of the for loop logic in Line 102. The evaluation may be performed in parallel on all bits of the compared data.

An example threshold value may be 0.001. For example, a threshold value may be determined where weight≥1000*$\Delta_{weight}$ i.e. in this example, there would not be an update if the weight is too large as compared to a delta (e.g., three orders of magnitude).

The threshold value may be a predetermined value stored in a memory register, or may be a dynamic value based on a size of the neural network nodes or layers. The threshold value may be a static threshold for all weights that does not change and is set in advance.

The threshold value may be a dynamic weight-specific threshold that's computed based on, for example: absolute weight value, current learning rate, or type of a layer. For convolutional layers the threshold could be larger and for fully connected layers the threshold could be smaller.

The threshold value may be a layer-specific threshold. For example, the threshold value may be based on all weights in one layer of a neural network depending on, for instance: layer type (convolutional, fully connected), statistical properties of weights in the layer, layer location in neural network (such as, layers close to input should have larger threshold and layers close to output should have smaller threshold).

Additionally, the threshold value may be adjusted as neural network trains. For example, at a beginning stage of processing, larger threshold values may be used to perform more frequent updates of a crossbar array, and the threshold value may be reduced to converge to some stable state, and then the threshold value decreased to decrease the update rate. From a mathematical view point, threshold based selective update is a form of regularization that helps achieve better generalization (classification accuracy on previously unseen input data).

At Line 106, if the data_to_comp values are not equal, the method otherwise performs the following steps. At Line 107, the variable changed_columns_bits is set to value of an ex-or operation for the data_to_comp value, and the new_data_to_write value. The method performs an ex-or operation to detect differences of the input vector data as compared to the data from the memristor. For example, changed_columns_bits=column_values that doesn't meet the threshold value are updated.

At Line 102, the method iterates through a predetermined number_of_column bits of the memristor array. The method uses a for loop logic construct, for j=0;j<number_of_column bits; j++, to evaluate each row, and increment to the row number value for each successive iteration. The value j is an index value used to reference a particular changed column bit.

At Line 109, the method determines if a particular changed_column_bits indexed by the value j is equal to the value 1. Here the method determines if a column bit has been changed. At Line 110, if the particular column bit has changed where the expression changed_columns_bits[j]==1 is true then the method performs a write to the memristor.

The for loop logic construct loops through and increments the value of j. The write_to_memristor[i][j] updates the memristor with the value of the particular updated column bit. The method writes the specific changed bit to a cell in the memristor row.

Figure 5:
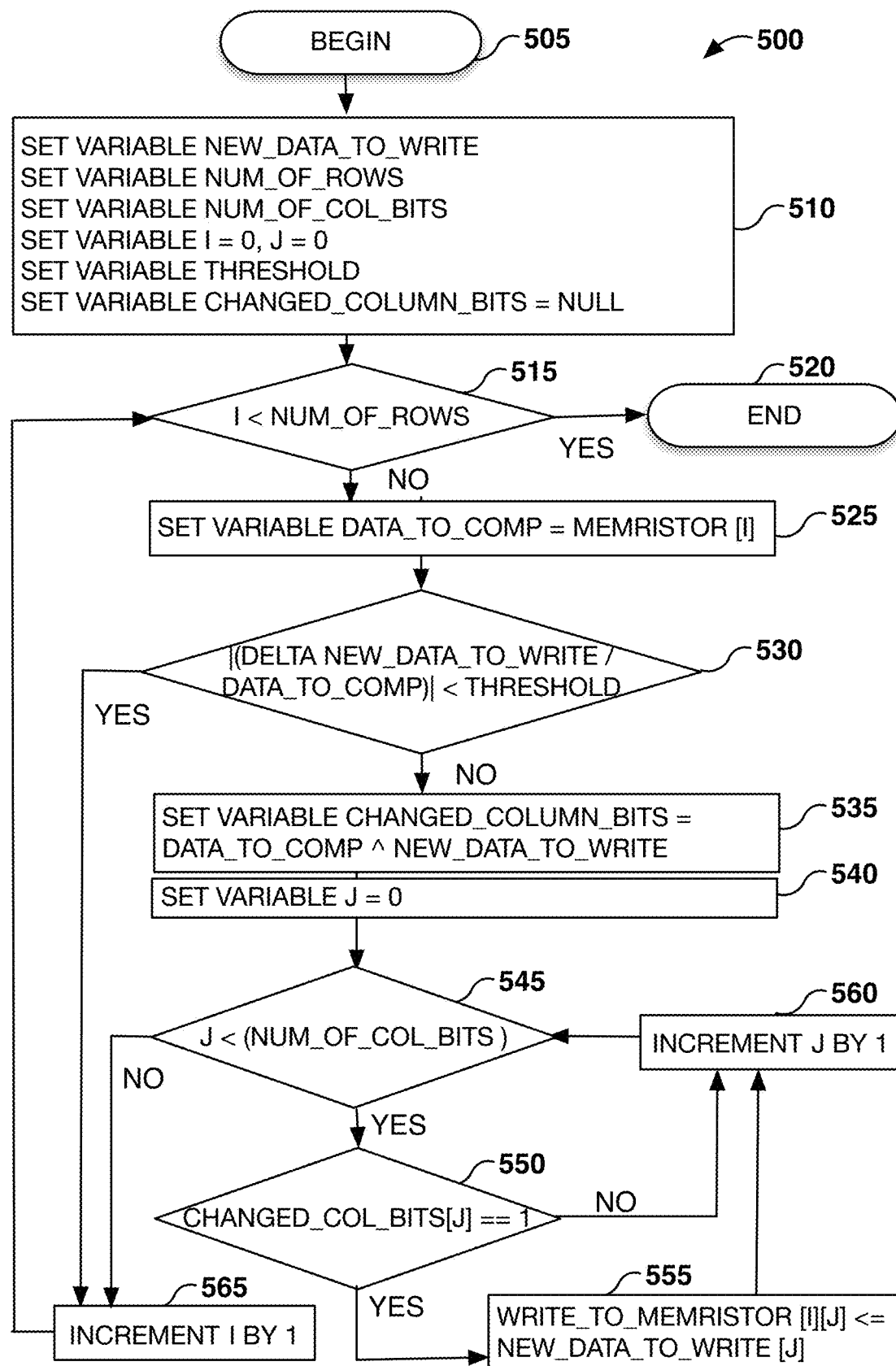
FIG. 5 is a flowchart of an example method for evaluating delta input vector data as to vector data previously loaded into a memristor memory.

FIG. 5 is a flowchart of an example method 500 for evaluating input vector data to vector data previously loaded into a memristor memory. The method 500 begins (block 505) and initializes a set of variables (block 510). The variable NEW_DATA_TO_WRITE is the received data input. The variable NUM_OF_ROWS are the number of memristor rows as determined by number of rows of memristor array (N) shown in the FIG. 1. The variable NUM_OF_COL_BITS are the number of column bits (M) of the memristor as determined by number of columns of memristor array shown in the FIG. 1. Column bits of the memristor are the data read from M column elements of the memristor array. Variables I and J are used for used for for-next loop counters as index values. The variable CHANGED_COLUMN_BITS is initialized to NULL, or can be initialized to FALSE.

In method determines if the NUM_OF_ROWS value is greater than the value of variable I (block 515). The first instance of this evaluation I will be set to zero. If the NUM_OF_ROWS value is greater then I, then the method will end (block 520). If the NUM_OF_ROWS value is less than or equal to I, then the method will continue. The method will then set the variable DATA_TO_COMP to the MEMRISTOR[index I] (block 525). In this first instance, the variable DATA_TO_COMP is set to the value of MEMRISTOR[index 0]. In this step, the first row of the memristor is read, and the value stored in variable DATA_TO_COMP. The data type of the variable MEMRISTOR[ ] can support adjustable bits per cell, so any commonly use computer programming datatypes such as integer or floating point can easily be stored in the memristor cell.

The method then evaluates whether |(DELTA NEW_DATA_TO_WRITE/DATA_TO_COMP)|<THRESHOLD. (block 530).

If the value of the absolute value of (DELTA NEW_DATA_TO_WRITE/DATA_TO_COMP) is less than the value of the THRESHOLD variable, then the method continues to block 565. If the above expression is true, this means that there is no need to update the memristor row with the input data. At block 565, the value of variable I is incremented by 1. The method then continues to block 515 as described above.

If the value of the absolute value of (DELTA NEW_DATA_TO_WRITE/DATA_TO_COMP) is greater than or equal to value of the THRESHOLD variable, then the method continues to block 535. The variable CHANGED_COLUMN_BITS is set to the output value of an EXOR operation for the variable DATA_TO_COMP and the variable NEW_DATA_TO_WRITE (block 525). Here the method is determining the changes of the new input data to the data in a particular row of the memristor. In the next step (block 540), variable J is initialized to the value zero.

The method then continues and updates particular changed column bits of the memristor row. In block 555, the method determined if the value of (NUM_OF_COL_BITS−1) is greater than the value of the variable J. If not, then the method proceeds to block 265, and increments the variable I by the value of 1. If the value of (NUM_OF_COL_BITS−1) is less than or equal to the value of the variable J, then method determines if CHANGED_COL_BITS[index J] is equal to 1. If CHANGED_COL_BITS[index J] is equal to zero, then this means that the data value for the column bit has not changed. The method then continues to block 560 and increments the variable J by a value of 1. If the CHANGED_COL_BITS[index J] is equal to 1, then this means that the data value for the column bit has changed. In this case the method proceeds to block 555. In block 555, the memristor memory location is written to. A write function is called or performed to WRITE_TO_MEMRISTOR[index I][index J] with the value from variable NEW_DATA_TO_WRITE[index J]. Next the method continues to block 250 and increments the variable J by a value of 1.

The foregoing description, for purposes of explanation, used specific nomenclature to provide a thorough understanding of the disclosure. However, it will be apparent to one skilled in the art that the specific details are not required to practice the systems and methods described herein. The foregoing descriptions of specific examples are presented for purposes of illustration and description. They are not intended to be exhaustive of or to limit this disclosure to the precise forms described. Obviously, many modifications and variations are possible in view of the above teachings. The examples are shown and described to best explain the principles of this disclosure and practical applications, to thereby enable others skilled in the art to best utilize this disclosure and various examples with various modifications as are suited to the particular use contemplated. It is intended that the scope of this disclosure be defined by the claims and their equivalents below.

We claim:

1. A memristive dot product system for vector processing, comprising:
   a crossbar array having a number of memory elements, the crossbar array having N rows, M columns and N×M memory elements;
   a vector input register comprising N voltage inputs to the crossbar array;
   a vector output register comprising M voltage outputs from the crossbar array; and
   an analog-to-digital converter (ADC) electronically coupled to the vector output register;
   a digital-to-analog converter (DAC) electronically coupled to the vector input register;
   a comparator processor electronically coupled to the ADC and to the DAC, the comparator processor configured to:
     compare output vector data from the vector output register to input vector data from a memory register;
     determine changed data values as between the output vector data and the input vector data; and
     write the changed data values to the memory elements of the crossbar array.

2. The dot product system of claim 1, wherein the comparator processor includes an EXOR circuit that calculates an exclusive OR between the input vector data and the output vector data to determine the changed data values.

3. The dot product system of claim 1, wherein the comparator processor includes a circuit to retrieve output vector data via the ADC for a row of the crossbar array.

4. The dot product system of claim 1, wherein the comparator processor includes a circuit to write the changed data values via the DAC to a memory element of the crossbar array.

5. The dot product system of claim 1, wherein the memory register for the input vector data is a memory location distinct from the memory elements of the crossbar array.

6. The dot product system of claim 1, wherein the input vector data is data representing an n-dimensional vector of numerical values.

7. The dot product system of claim 1, wherein the input vector data describes a plurality of model weights for training a neural network.

8. A method comprising:
   receiving a set of output vector data rom an output of a memristor crossbar array, the memristor crossbar array having a number of memory elements, the crossbar array having N rows, M columns and N×M memory elements;
   receiving from a memory register a set of input vector data;
   evaluating the set of output vector data to the set of input vector data;
   determining changed data values as between the output vector data and the input vector data; and
   writing the changed data values to the to the memory elements of the crossbar array.

9. The method of claim 8, wherein evaluating the set of output vector data to the set of input vector data comprises:
   performing an operation to determine whether an absolute value of the input vector data divided by the output vector data is less than a predetermined threshold value, wherein the output vector data represents weight values and the input vector data represents delta weight values.

10. The method of claim 8, wherein the set of output vector data is received via an analog-to-digital converter electronically coupled to the crossbar array.

11. The method of claim 8, wherein the changed data values are written to the memory elements of the crossbar array via a digital-to-analog converter electronically coupled to the crossbar array.

12. The method of claim 8, wherein the memory register for the input vector data is a memory location distinct from the memory elements of the memristor.

13. The method of claim 8, wherein the input vector data is data representing an n-dimensional vector of numerical values.

14. The method of claim 8, wherein the input vector data describes a plurality of model weights for training a neural network.

15. A non-transitory computer storage device storing instructions operable to cause one or more computer methods to perform operations comprising:
   receiving a set of output vector data from an output of a memristor crossbar array, the memristor crossbar array having a number of memory elements, the crossbar array having N rows, M columns and N×M memory elements;
   receiving from a memory register a set of input vector data;
   comparing the set of output vector data to the set of input vector data;
   determining changed data values as between the output vector data and the input vector data; and
   writing the changed data values to the to the memory elements of the crossbar array.

16. The non-transitory computer storage device of claim 5, wherein comparing the set of output vector data to the set of input vector data comprises:
   performing an exclusive OR operation between the input vector data and the output vector data to determine the changed data values.

17. The non-transitory computer storage device of claim 15, wherein the set of output vector data is received via an analog-to-digital converter electronically coupled to the crossbar array.

18. The non-transitory computer storage device of claim 15, wherein the changed data values are written to the memory elements of the crossbar array via a digital-to-analog converter electronically coupled to the crossbar array.

19. The non-transitory computer storage device of claim 15, wherein the memory register for the input vector data is a memory location distinct from the memory elements of the memristor.

20. The non-transitory computer storage device of claim 15, wherein the input vector data is data representing an n-dimensional vector of numerical values.

* * * * *